United States Patent
Tsukagoshi

(10) Patent No.: US 8,157,142 B2
(45) Date of Patent: Apr. 17, 2012

(54) FEED AMOUNT DATA SETTING SYSTEM FOR TAPE FEEDER, TAPE FEEDER, MOUNTER

(75) Inventor: Kazuhiro Tsukagoshi, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 356 days.

(21) Appl. No.: 12/376,515
(22) PCT Filed: Aug. 2, 2007
(86) PCT No.: PCT/JP2007/065187
§ 371 (c)(1), (2), (4) Date: Feb. 5, 2009
(87) PCT Pub. No.: WO2008/018365
PCT Pub. Date: Feb. 14, 2008

(65) Prior Publication Data
US 2010/0181361 A1    Jul. 22, 2010

(30) Foreign Application Priority Data
Aug. 8, 2006  (JP) .................. 2006-216105

(51) Int. Cl.
B65H 23/18 (2006.01)
(52) U.S. Cl. ............... 226/32; 226/76; 226/133; 29/740
(58) Field of Classification Search ............ 29/739–740, 29/705, 719, 721–722, 833; 414/222.01, 414/223, 416.05; 226/32, 45, 133; 700/108, 700/169–171
See application file for complete search history.

(56) References Cited

U.S. PATENT DOCUMENTS

| | | | |
|---|---|---|---|
| 5,865,359 A * | 2/1999 | Kanai | 226/122 |
| 6,032,845 A | 3/2000 | Piccone et al. | |
| 6,824,033 B2 * | 11/2004 | Chon | 226/128 |
| 6,902,090 B2 * | 6/2005 | Yamamura et al. | 226/32 |
| 7,036,702 B2 | 5/2006 | Liebeke | |
| 7,243,828 B2 * | 7/2007 | Ricketson | 226/128 |
| 2005/0096781 A1 | 5/2005 | Sumida et al. | |

FOREIGN PATENT DOCUMENTS

| | | |
|---|---|---|
| CN | 1633831 A | 6/2005 |
| JP | 2003-124686 A | 4/2003 |
| JP | 2003-124687 A | 4/2003 |
| JP | 2003-188580 A | 7/2003 |
| WO | 02/080643 A1 | 10/2002 |
| WO | 03/071847 A1 | 8/2003 |

OTHER PUBLICATIONS

Chinese Office Action issued on Oct. 20, 2010; Chinese Patent Application No. 200780029548.7 with English Abstract.
Supplementary European Search Report dated Nov. 19, 2010; Application No. EP 07 79 1861.
Masashi Honda; International Search Report; PCT/JP2007/065187; Mar. 13, 2008.

* cited by examiner

*Primary Examiner* — Minh Trinh
(74) *Attorney, Agent, or Firm* — Studebaker & Brackett PC; Donald R. Studebaker

(57) ABSTRACT

A mounter is operable to sequentially detect feed amounts of a motor at respective times when respective electronic components held by a tape reach a pickup position, while rotating a sprocket 52 of a tape feeder 50 360 degrees or more, and store the feed amounts in correspondence with respective pins 54 drivingly feeding the tape. This makes it possible to reliably duplicate a state when each electronic component reaches the pickup position, based on a feed amount itself of the motor at a time when each electronic component truly reaches a pickup position.

4 Claims, 14 Drawing Sheets

FIG.7

| PIN NUMBER | POSITION DATA |
|---|---|
| 1 | $Y_1$ |
| 2 | $Y_2$ |
| 3 | $Y_3$ |
| ... | ... |
| N−1 | $Y_{N-1}$ |
| N | $Y_N$ |

FIG.11

| PIN NUMBER | POSITION DATA |
|---|---|
| 1 | $Y_1$ |
| 1-2 | $Y_{1-2}$ |
| 2 | $Y_2$ |
| 2-3 | $Y_{2-3}$ |
| ⋮ | ⋮ |
| N-1 | $Y_{(N-1)}$ |
| (N-1)-N | $Y_{(N-1)-N}$ |
| N | $Y_N$ |

FEED AMOUNT DATA SETTING SYSTEM FOR TAPE FEEDER, TAPE FEEDER, MOUNTER

TECHNICAL FIELD

The present invention relates to a mounter, a tape feeder designed to be installed in the mounter to supply electronic components, and a feed amount data setting system for the tape feeder.

BACKGROUND ART

Heretofore, it has been known to install a tape feeder in a mounter for mounting electronic components onto a board, as a component supply device for supplying the electronic components to the mounter.

Typically, this type of tape feeder is equipped with a reel wound with a tape which holds electronic components at certain intervals, and adapted to feed the tape pulled out from the reel, to a pickup position where each of the electronic components is suckingly held by a transfer head of the mounter.

The tape which holds the electronic components is provided with feed holes at a given pitch, and a sprocket equipped in the tape feeder is drivenly rotated intermittently by a given feed amount, while bringing a plurality of pins provided on the sprocket into engagement with the feed holes of the tape, whereby the electronic components held by the tape sequentially reach the pickup position.

In the above tape feeder, a situation has arisen where even if the sprocket is rotated by a given feed amount, an actual moving amount is liable to vary due to a production error in individual tape feeders, etc., to cause an inability to accurately feed each of the electronic components to the pickup position.

Therefore, there has been proposed a technique of, in advance of an actual mounting operation, recognizing a position of a sprocket or a tape just after being fed by a given feed amount to derive a deviation relative to a true position, as an offset amount, and, during the mounting operation, performing a feed operation while correctively adding/subtracting the offset amount to/from the given feed amount, to feed each component to an estimated true position derived by the calculation, as disclosed, for example, in JP 2003-124686A (paragraphs [0025] and [0026]) and JP 2003-124687A (paragraphs [0029] and [0030]).

However, the technique disclosed in the above documents is intended to feed each component to an estimated true position derived by correcting a deviation relative to the given feed amount, i.e., derived absolutely by calculation, and thereby the estimated true position is likely to deviate from a proper true position. Thus, there has remained a need for improvement in view of achieving an accurate pickup operation.

DISCLOSURE OF THE INVENTION

In view of the above problem, it is an object of the present invention to provide a feed amount data setting system for a tape feeder, and other related devices, which are capable of reliably setting an adequate feed amount of a tape in the tape feeder to achieve an accurate pickup operation.

In order to achieve this object, the present invention provides a feed amount data setting system for a tape feeder, wherein the tape feeder includes a sprocket formed with a plurality of pins engageable with respective feed holes provided in a tape which holds electronic components, and a motor adapted to drivingly rotate the sprocket to drivingly feed the tape. The feed amount data setting system is configured to set a feed amount of the motor for allowing the electronic components held by the tape to be sequentially fed to a given pickup position, in such a manner as to rotationally control the motor to rotate the sprocket 360 degrees or more, while sequentially detecting feed amounts of the motor at respective times when respective ones of the electronic components held by the tape reach the pickup position, and store the sequentially detected feed amounts in a feed amount data storage device equipped in the feeder or a mounter, in correspondence with respective ones of the pins engaged with the feed holes of the tape to drivingly feed the tape at the respective times when the respective electronic components reach the pickup position.

In this system, instead of calculating a feed amount by correctively adding/subtracting a deviation amount (offset amount) to/from a certain feed amount, and feeding each electronic component to an estimated true position derived by the calculation, a feed amount itself of the motor at a time when each electronic component truly reaches a pickup position is stored. This makes it possible to duplicate a state when each electronic component reaches the pickup position, to achieve an accurate pickup operation.

The present invention also provides a tape feeder which comprises a sprocket formed with a plurality of pins engageable with respective feed holes provided in a tape which holds electronic components, a motor adapted to drivingly rotate the sprocket to drivingly feed the tape, and a feed amount data storage device adapted to store feed amounts of the motor at respective times when respective ones of the electronic components held by the tape reach a given pickup position, in correspondence with respective ones of the pins engaged with the feed holes of the tape to drivingly feed the tape at the respective times when the respective electronic components reach the pickup position, wherein the motor is subjected to a drive control based on the feed amounts stored in the feed amount data storage device.

In this tape feeder, the tape feeder stores respective feed amounts of the pins by itself. This makes it possible to accurately feed each electronic component to the pickup position to achieve an accurate pickup operation, even if the tape feeder is installed in any installation position of a mounter.

Further, the present invention provides a mounter designed to allow a tape feeder to be installed therein, wherein the tape feeder includes a sprocket formed with a plurality of pins engageable with respective feed holes provided in a tape which holds electronic components, and a motor adapted to drivingly rotate the sprocket to drivingly feed the tape. The mounter comprises a feed amount data storage device adapted to store feed amounts of the motor at respective times when respective ones of the electronic components held by the tape reach a given pickup position, in correspondence with respective ones of the pins engaged with the feed holes of the tape to drivingly feed the tape at the respective times when the respective electronic components reach the pickup position, and a motor controller operable to perform a drive control for the motor, based on the feed amounts stored in the feed amount data storage device.

In this mounter, the mounter stores respective feed amounts of the pins of the tape feeder. The makes it possible to allow the tape feeder installed in the mounter to accurately feed each electronic component to the pickup position to achieve an accurate pickup operation.

BRIEF DESCRIPTION OF DRAWINGS

FIG. 7 illustrates one example of feed amount data to be set.

FIG. 11 illustrates one example of feed amount data to be set in the second example.

BEST MODE FOR CARRYING OUT THE INVENTION

Figure 1:
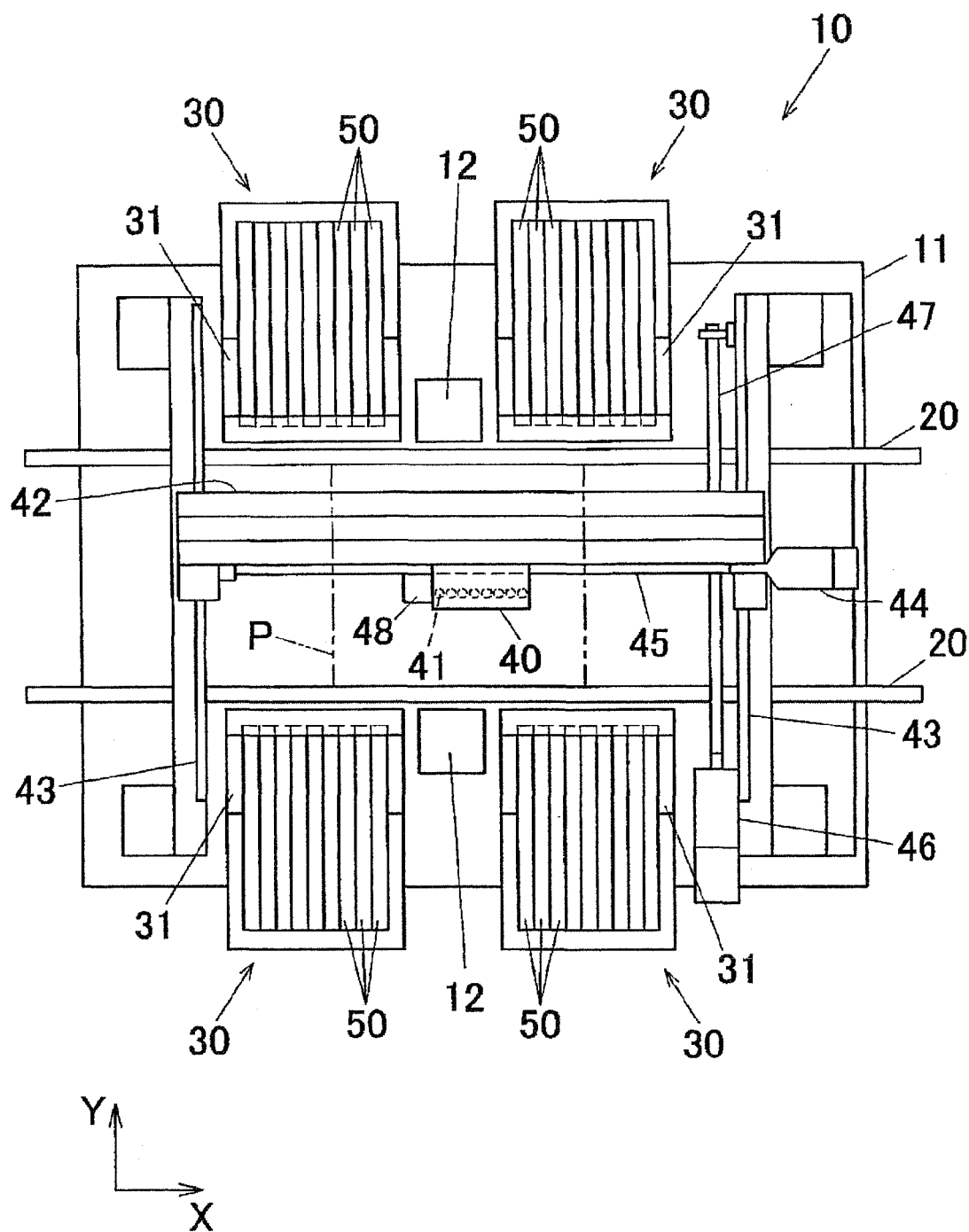
FIG. 1 is a top plan view showing a mounter according to an embodiment of the present invention.

FIG. 1 is a top plan view showing a mounter according to one embodiment of the present invention. As shown in FIG. 1, the mounter 10 comprises two conveyers 20 disposed on a base 11 to carry a printed circuit board P, a plurality of component supply sections 30 disposed on both sides of the conveyers 20, and an electronic component-mounting head unit 40 provided above the base 11.

The head unit 40 is adapted to be movable in a region over and between each of the component supply sections 30 and a mounting position on the board P so as to pick up an electronic component from the component supply section 30 and mount the electronic component onto the board P. Specifically, the head unit 40 is supported by a head-unit support member 42 extending in an X-axis direction (a board-carrying direction of the conveyer 20), in such a manner as to be movable in the X-axis direction. The head-unit support member 42 is movably supported by two guide rails 43 extending in a Y-axis direction (a direction perpendicular to the X-axis in a horizontal plane) at respective opposite ends thereof, in such a manner as to be movable in the Y-axis direction. The head unit 40 is adapted to be drivenly moved in the X-axis direction by an X-axis motor 44 through a ball screw shaft 45, and the head-unit support member 42 is adapted to be drivenly moved in the Y-axis direction by a Y-axis motor 46 through a ball screw shaft 47.

The head unit 40 is equipped with a plurality of heads 41 arrayed in the X-axis direction. Each of the heads 41 is adapted to be drivenly moved in an upward-downward direction (a Z-axis direction) by a lifting/lowering mechanism having a Z-axis motor as a driving source, and drivenly moved in a rotation direction (an R-axis direction) by a rotational drive mechanism having an R-axis motor as a driving source.

Further, each of the heads 41 has a suction nozzle provided at a distal end thereof to suckingly hold an electronic component and mount the electronic component onto the board. Each of the nozzles is adapted, during a component sucking operation, to be supplied with a negative pressure from a negative-pressure device (not shown) so as to pick up an electronic component while suckingly hold the electronic component by a suction force based on the negative pressure.

The head unit 40 is also provided with a board-imaging camera 48 composed, for example, of a CCD camera equipped with an illumination lamp. The board-imaging camera 48 is adapted to take an image of a position reference mark and/or a board ID mark provided on a board P carried in the mounter 10. Further, the board-imaging camera 48 is adapted to serve as a means to take an image around of a pickup position of an electronic component during an operation of setting a motor feed amount in each of a plurality of tape feeders 50 to be installed in each of the component supply sections 30.

The component supply sections 30 are provided, respectively, in upstream and downstream regions and on front and rear sides relative to the conveyers 20, i.e. in a total number of four. Each of the component supply sections 30 has a feeder plate adapted to allow the plurality of tape feeders 50 each serving as a component supply device to be attached thereonto in a parallel arrangement.

Further, two component-imaging cameras 12 are provided, respectively, between the two front-side component supply sections 30 located in the upstream and downstream regions separately and between the two rear-side component supply sections 30 located in the upstream and downstream regions separately. Each of the component-imaging cameras 12 is adapted to take an image of an electronic component suckingly held by the head unit 40 to detect a positional deviation relative to the suction nozzle, etc.

Figure 2:
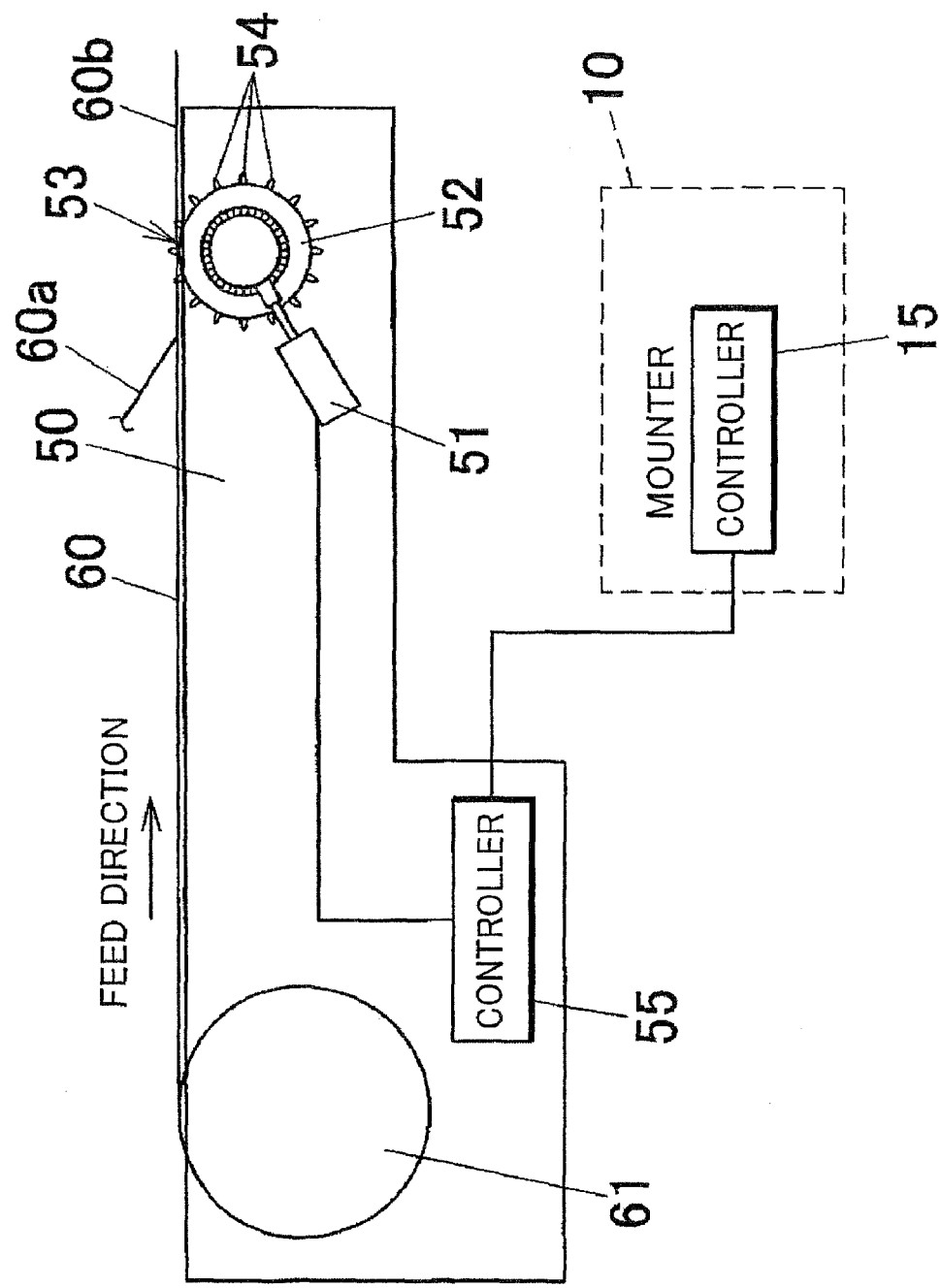
FIG. 2 is an explanatory diagram of a schematic configuration of a tape feeder in the mounter according to the embodiment.

FIG. 2 is an explanatory diagram of a schematic configuration of each of the tape feeders in the mounter according to this embodiment. As shown in FIG. 2, the tape feeder 50 is formed as an electric motor-driven type component supply device having a motor 51 as a driving source.

The tape feeder 50 is equipped with a reel 61 wound with a tape 60 which holds electronic components. The tape 60 pulled out from the reel 61 is drivenly fed by a sprocket 52 adapted to be drivenly rotated by the motor 51. Thus, the electronic components held by the tape are sequentially fed to a given pickup position 53 where each of the electronic components is picked up by the head unit 40. In this embodiment, the pickup position 53 is set on a downstream side relative to a position where a cover tape 60a is peeled from a tape body 60a, and in the same position as an uppermost region of the sprocket 52, with respect to the feed direction of the tape 60.

Figure 3:
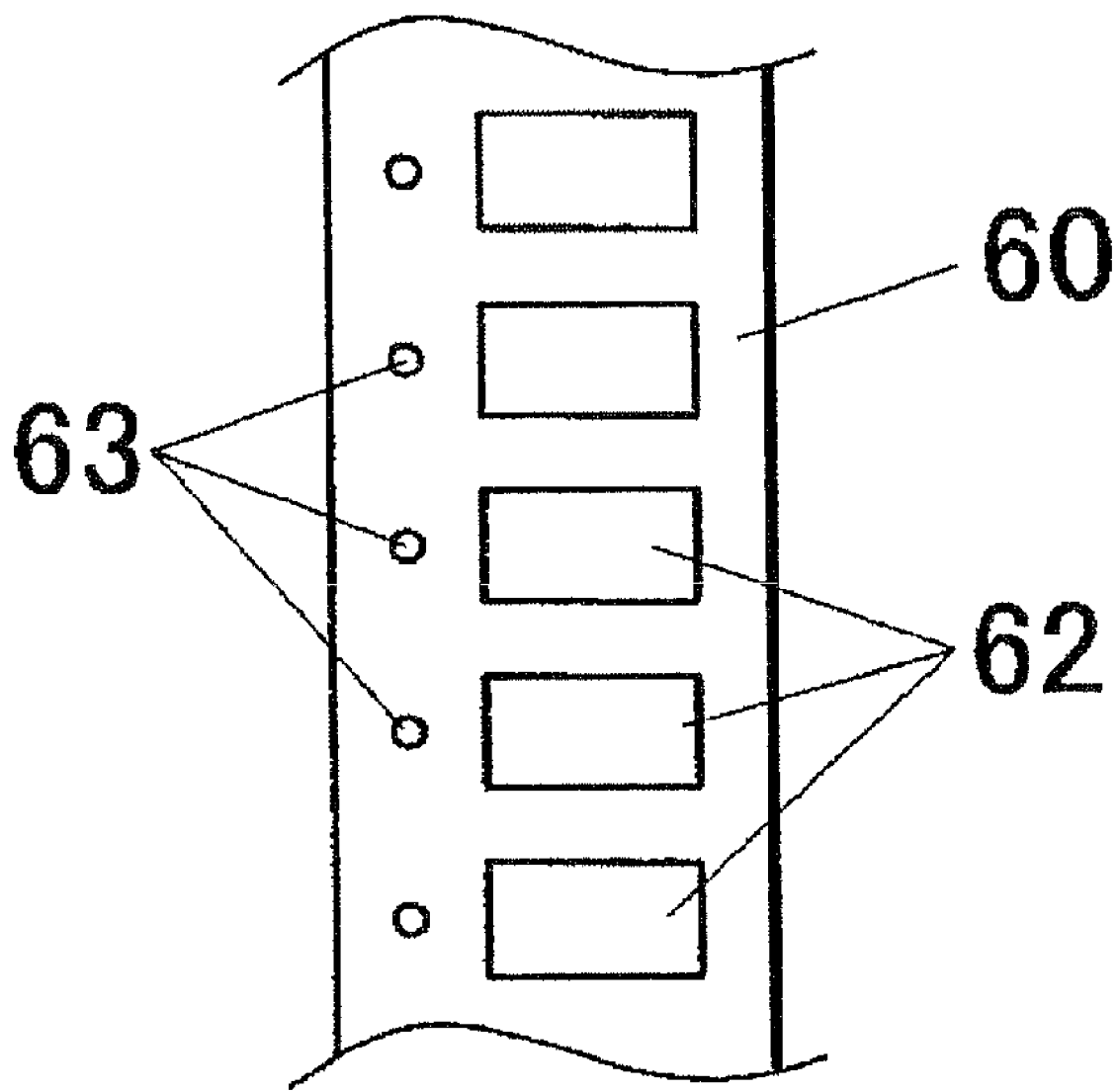
FIG. 3 is a top plan view showing one example of a component supply tape.

FIG. 3 is a top plan view showing one example of the component supply tape. As shown in FIG. 3, the tape 60 has a large number of component pockets 62 provided at given pitch equal to a pitch of after-mentioned pins 54 of the sprocket 52 and each formed to receive therein a small piece of component, such as an IC or a transistor, and a large number of feed holes 63 of the tape 60 are provided just beside respective centers (in the feed direction) of the component pockets 62 at an even pitch. Data about a positional relation between and pitch data about the feed hole 63 and the component pocket 62 are pre-stored in a memory of a controller 55 of the feeder, in correspondence with ID data of the tape 60.

The sprocket 52 of the tape feeder 50 has a plurality of pins 54 which are provided at a pitch equal to that of the feed holes 63 of the tape, and formed to protrude in a radial direction thereof. The pins 54 provided on the sprocket 52 are formed and arranged to be engageable with respective ones of the feed holes 63 provided in the tape 60 to drivingly feed the tape 60.

The motor 51 for drivingly rotating the sprocket 52 is composed, for example, of a servomotor capable of controlling a rotational angle (phase), and adapted to be controllably rotated according to a control signal from the motor controller 55 equipped in the tape feeder 50. The motor 51 incorporates an encoder adapted to detect a rotational angular position of the motor 51, and output information about the rotational angular position to the motor controller 55.

In the tape feeder 50 according to this embodiment, the motor controller 55 of the tape feeder 50 is adapted, in a state after the tape feeder 50 is installed in the mounter 10, to be electrically connected to a controller 15 of the mounter 10 to receive/send signals, such as a drive control signal for the motor 50, from/to the mounter 10, while being supplied with driving power for the motor 51 and others from the mounter 10.

Further, in this embodiment, each of the tape feeders 50 is adapted to store adequate motor feed amount data for accurately feeding each electronic component to the pickup position, by itself. Specifically, the motor controller 55 is operable to store adequate feed amounts of the motor 51 (i.e., motor feed amount) for the respective pins 54, in a memory provided therein to serve as a feed amount data storage device.

The rotational feed amounts of the motor 51 for the respective pins 54 in each of the tape feeders 50 are derived in advance of an operation of actually mounting each electronic component onto the board, and, during the actual component mounting operation, a drive control for the motor 51 is performed based on pre-stored feed amounts to feed each electronic component to the pickup position 53.

The feed amounts of the motor 51 for the respective pins 54 may be set using a single-purpose feed amount setting apparatus. In this embodiment, the mounter 10 is configured to additionally function as a feed amount data setting apparatus for setting adequate feed amounts for each of the tape feeders 50 installed therein.

The following description will be made about a first example where the mounter 10 is configured to function as a feed amount data setting apparatus to set adequate feed amounts for each of the tape feeders 50.

In the first example, an image of each of the pins 54 formed on the sprocket 52 of each of the tape feeders 50 is taken by a camera, to detect a state when each electronic component held by the tape 60 reaches the pickup position 53. Thus, in the first example, the data setting operation is performed without attaching the tape 60 to the tape feeder 50.

Figure 4:
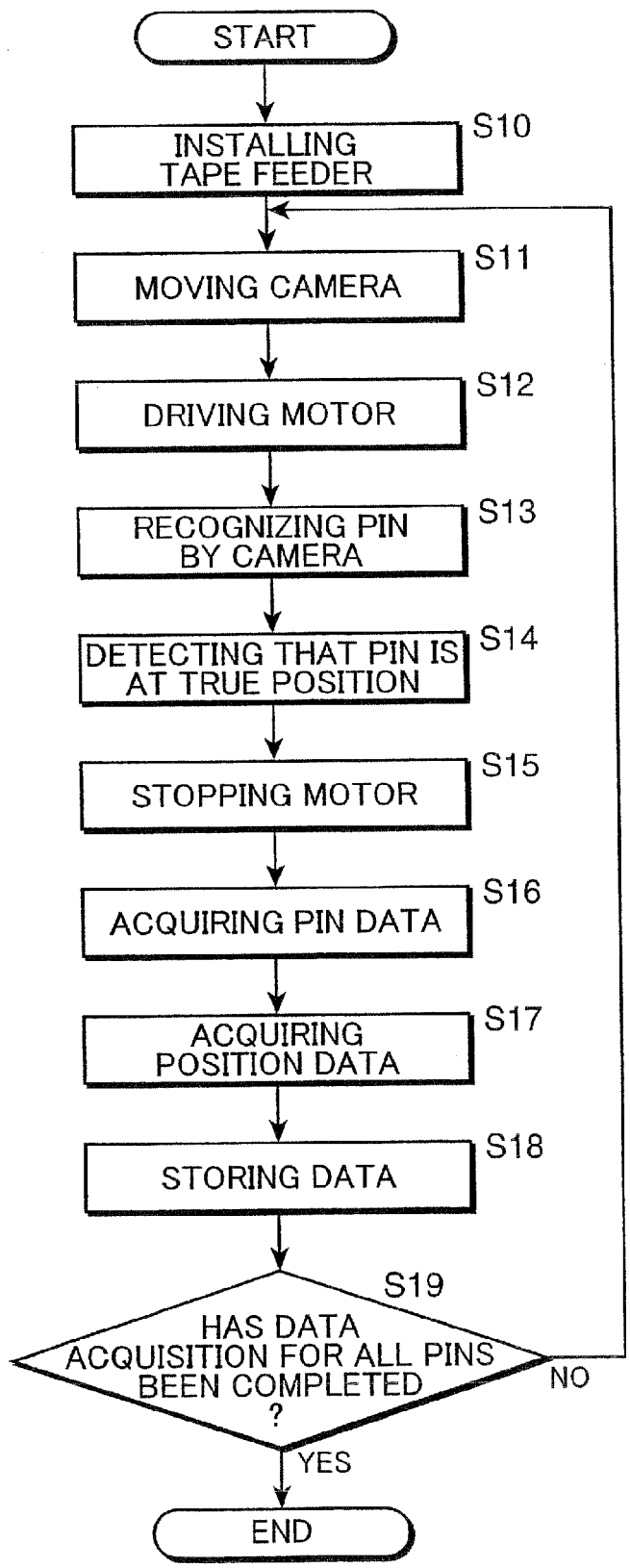
FIG. 4 is a flowchart showing a process in a first example of a feed amount data setting system for the tape feeder.
Figure 5:
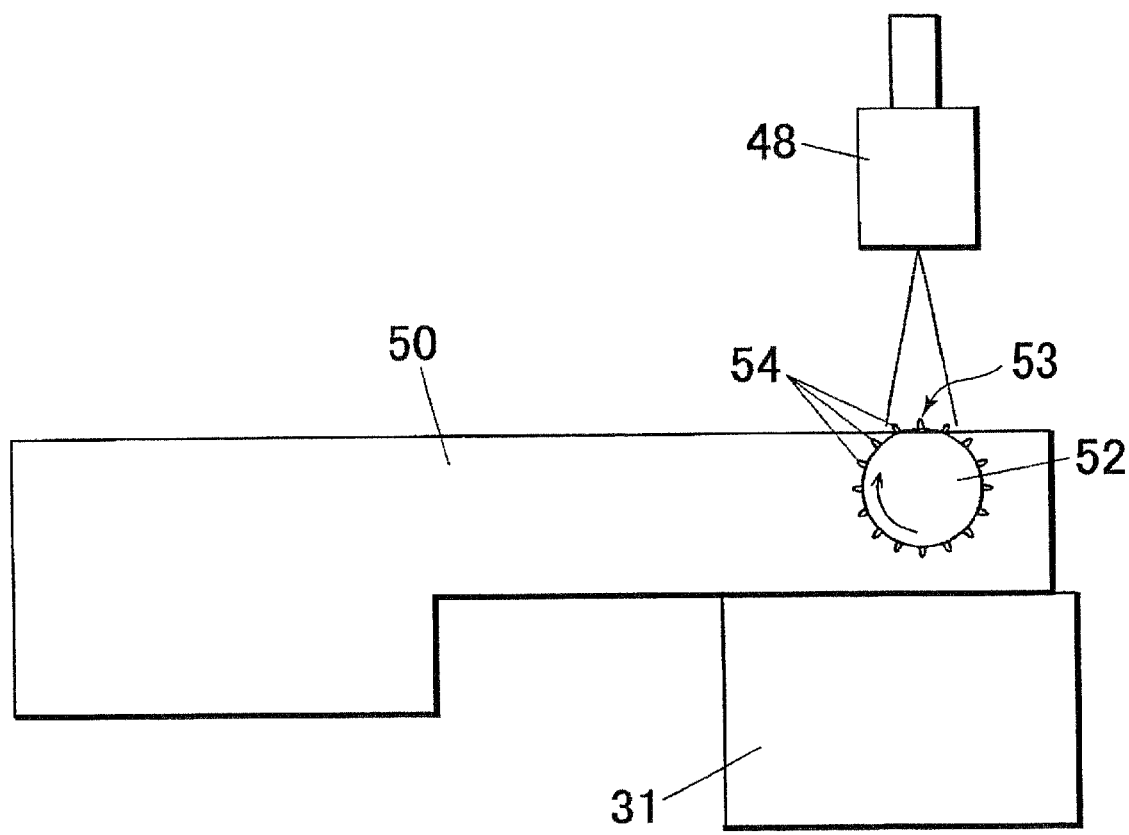
FIG. 5 is a front view of the first example.
Figure 6:
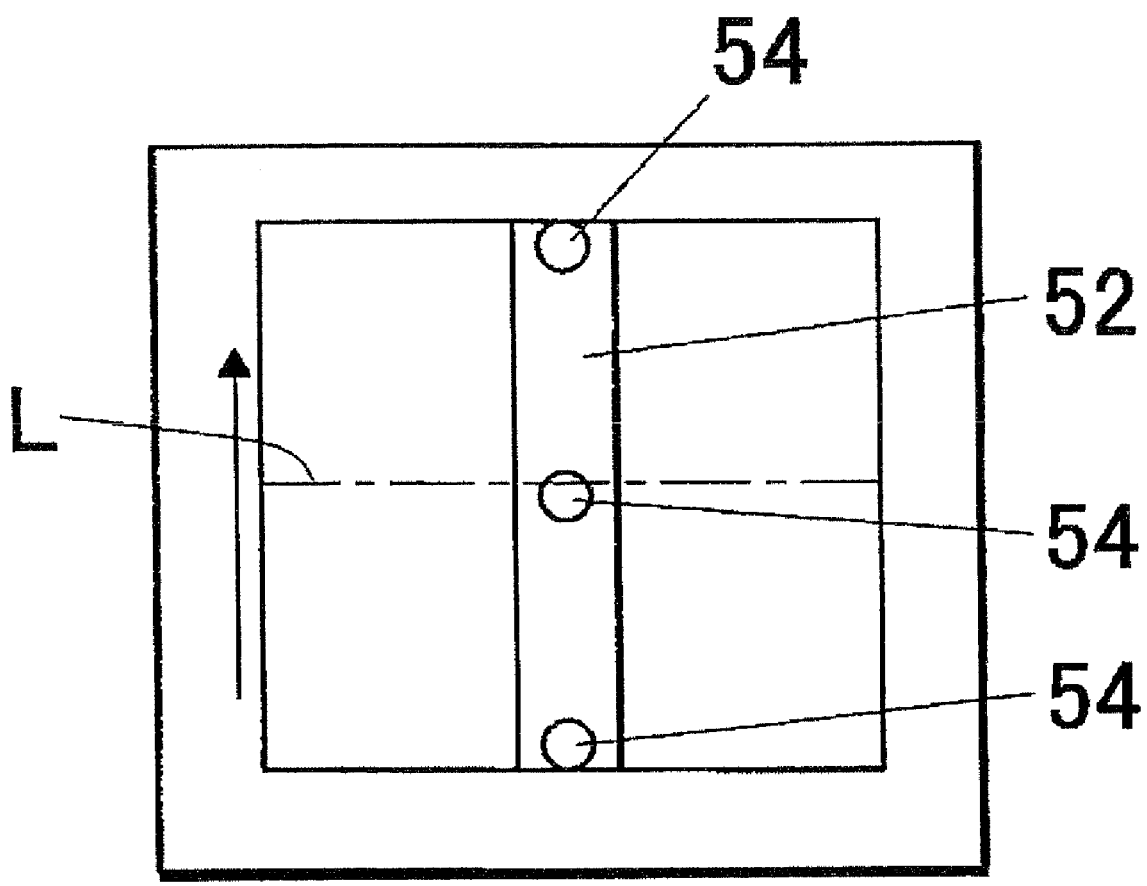
FIG. 6 illustrates one example of an image taken by a camera in the first example.

FIG. 4 is a flowchart showing a process in the first example where feed amount data of the tape feeder is set for a tape having the feed holes 63 arranged just beside respective centers (in the feed direction) of the component pockets 62. FIG. 5 is a front view of the first example, and FIG. 6 illustrates one example of an image taken by the camera in the first example.

In the first example, the tape feeder 50 as a target for data setting is attached onto the feeder plate 31 of the mounter (feed amount setting apparatus) 10 (Step S10), and the board-recognition camera 48 of the mounter 10 is moved to a position capable of taking an image around the pickup position 53 of the target tape feeder 50 (Step S11).

Subsequently, according to a drive command from the controller 15 of the mounter 10, the motor 51 is driven through the motor controller 55 of the feeder 50 (Step S12). Thus, the sprocket 52 of the target tape feeder 52 is drivenly rotated to move the pins 54 provided on the sprocket 52, and respective positions of the pins 54 are sequentially captured by the board-recognition camera 48 (Step S13).

Although the plurality of pins are formed on the sprocket 52 of the target tape feeder 50, a specific one of the pins 54 located in the uppermost region of the sprocket 52 at any given time is brought into engagement with one of the feed holes 63 of the attached tape 60 to drivingly feed the tape 60. As mentioned above, the pickup position 53 in the tape feeder in this embodiment is set in the same position as the uppermost region of the sprocket 52 in the feed direction of the tape 60, and the component pockets 62 are provided just beside the respective feed holes 62.

Thus, it can be considered that, when the specific pin 54 located in the uppermost region of the sprocket 52 is located just beside the pickup position 53, one of the electronic components received in the component pockets 62 reaches the pickup position 53. In the first example, a position of one of the pins 54 at a time when one of the electronic components reaches the pickup position 53, i.e., a position of one of the pins 54 at a time when a center of the pin 54 reaches a position on a line L extending in a direction perpendicular to the feed direction of the tape 60 and passing through the pickup position 53, will referred to as "true position" of the pin.

When the specific pin 54 located in the uppermost region of the sprocket 52 is moved, and, in an image taken by the camera 48, it is detected that the specific pin 54 reaches a position on the line L extending in the direction perpendicular to the feed direction of the tape 60 and passing through the pickup position 53 (Step S14), the motor 51 is stopped according to a stop command from the controller 15 of the mounter 10, through the motor controller 55 of the feeder 50 (Step S15).

Then, the specific pin 54 located at a true position thereof, i.e., one of the pins 54 which is engaged with the feed hole 63 of the tape 60 to drivingly feed the tape 60, is identified by a pin number or the like, and the identification information is acquired as pin data (Step S16). The information for identifying each of the pins 54 may be acquired by making a visual (optical) or magnetic identification mark or the like on each of the pins 54, and detecting the identification mark or the like using the board-imaging camera 48 or other detection device, or may be obtained by setting any one of the pins as a reference pin, making an identification mark or the like on each of the remaining pins, and identifying each of the remaining pins based on an n-th number to the reference pin in a feed direction of the sprocket 52. Instead of making an identification mark or the like, the information for identifying each of the pins 54 may be obtained by slightly displacing a position of a reference pin in a circumferential or radial direction, detecting the displacement to identify the reference pin, and identifying each of the remaining pins based on an nth-number to the reference pin.

After the specific pin 54 located at the true position is identified in the above manner, a rotational amount (rotational angle) of the motor 51 in a state when the specific pin 54 is located at the true position is detected by the encoder equipped in the motor 51, and acquired as position data (Step S17).

After the pin data and position data about the specific pin 54 are acquired in the above manner, the two data are stored in the feed amount data storage device of the target tape feeder 50 in correspondence with each other (Step S18), and the above steps will be repeated until pin data and position data about all the pins 54 are acquired (NO in Step S19), i.e., until the sprocket 52 is rotated 360 degrees or more. When data acquisition for all the pins 54 is completed (YES in Step S19), the feed amount data setting process for the target tape feeder 50 is terminated.

FIG. 7 shows on example of feed amount data to be set in the above manner. As shown in FIG. 7, in this example, the pins 54 are identified, respectively, by pin numbers 1 to N, and position data of the pins 54 are set, respectively, as Y1 to YN.

A specific representation method for the position data may include a method of representing a distance between adjacent ones of the pins 54 by a rotational feed amount of the motor, i.e., serial data or a pulse number of the encoder. In this case, the position data Y1 of the pin number 1 is a rotational amount of the motor in a period after the preceding pin 54 having the pin number N reaches a true position thereof through until the pin 54 having the pin number 1 reaches a true position thereof, which is represented by a pulse number of the encoder or the like, and the position data Y2 of the pin number 2 is a rotational amount of the motor in a period after the preceding pin 54 having the pin number 1 reaches the true position through until the pin 54 having the pin number 2 reaches a true position thereof, which is represented by a pulse number of the encoder or the like.

As another representation method for the position data, a distance in a period where each of the pins 54 is moved from a position corresponding to a zero phase of the motor 51 to a true position thereof, may be represented by a rotational feed amount of the motor, i.e., serial data or a pulse number of the encoder. In this case, the position data Y1 of the pin number 1 is a feed amount in a period where the pin 54 is moved from a position corresponding to a zero phase of the motor 51 to a true position thereof, which is represented by a rotational amount of the motor.

As yet another representation method for the position data, a distance in a period where each of the pins 54 of the sprocket 52 is moved to a true position thereof from a position at a time when a specific one of the pins 54 selected as an origin is located at a true position thereof, may be represented by a rotational feed amount of the motor, i.e., serial data or a pulse number of the encoder. In this case, given that the pin 54 having the pin number 1 is selected as an origin, Y1 is zero, and Y2 and the subsequent position data is an feed amount in a period where each of the remaining pins 54 is moved from a position corresponding to Y1 to a true position thereof, which is represented as a rotational amount of the motor.

In the first example, a feed amount of the motor at a time when each electronic component reaches the pickup position is directly set and stored. Differently from the technique of feeding each component to an estimated true position derived by calculation, this makes it possible to reliably duplicate a state when each electronic component reaches the pickup position 53, to achieve an accurate pickup operation.

In addition, an image of each of the pins 54 is taken by the camera 48 in a vicinity of the pickup position 53. This makes it possible to accurately detect a state when each electronic component reaches the pickup position 53, to allow a feed amount of the motor 51 at a time when each electronic component reaches the pickup position 53, to be accurately acquired.

Further, each of the tape feeders stores respective feed amounts of the pins 54 equipped therein, by itself. This makes it possible to accurately feed each electronic component to the pickup position to achieve an accurate pickup operation.

The following description will be made about a second example where the mounter 10 is configured to function as a feed amount data setting apparatus to set adequate feed amounts for each of the tape feeders 50.

In the second example, an image of a component pocket 62 of a tape 60 attached to the tape feeders 50 or an electronic component received in the component pocket 62 is taken by a camera, to detect that the electronic component held by the tape 60 reaches the pickup position 53. In the second example, the tape 60 as a target for feed amount data setting has a large number of component pockets 62 provided at a pitch one-half of that of the pins 54 of the sprocket 52, and a large number of feed holes 63 are provided alternately relative to and just beside respective centers (in the feed direction) of the component pockets 62 at an even pitch. Data about a positional relation between and pitch data about the feed hole 63 and the component pocket 62 are pre-stored in a memory of the controller 55 of the feeder, in correspondence with ID data of the tape 60. A master tape or the like may be attached to use for this feed amount data setting operation.

Figure 8:
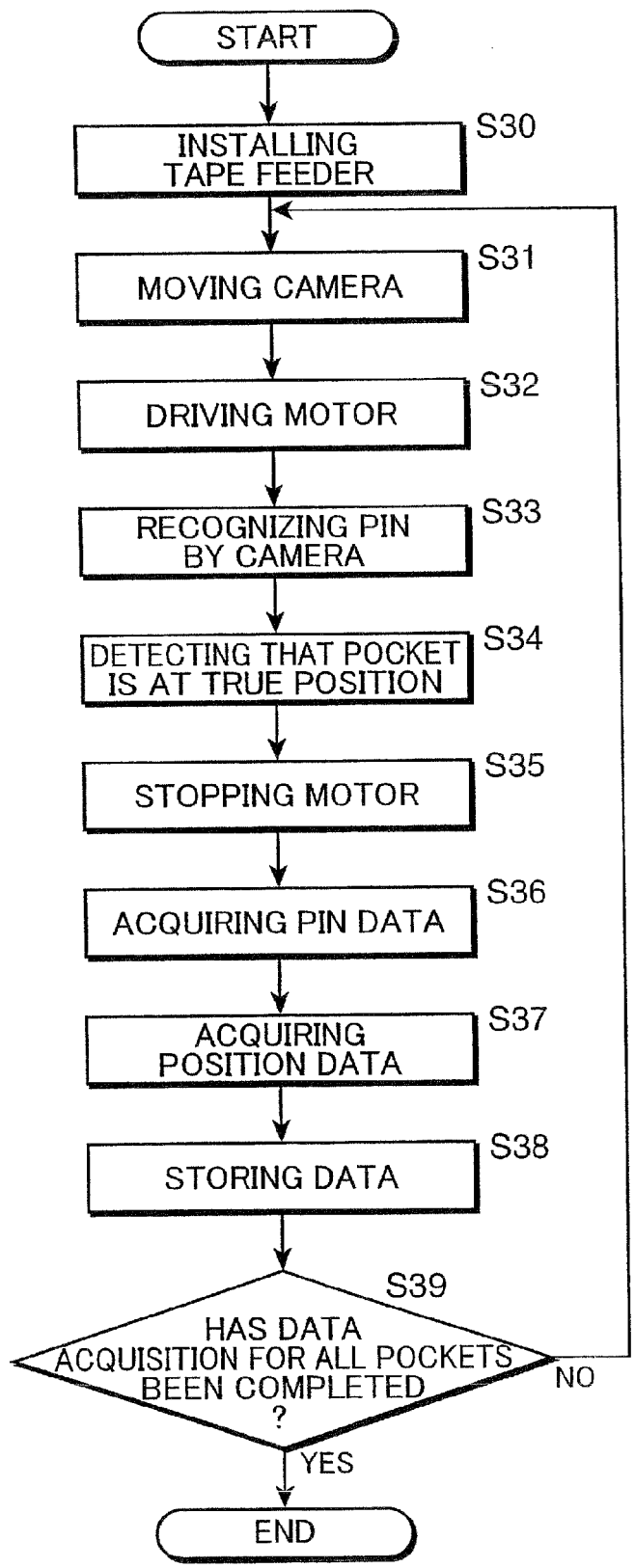
FIG. 8 is a flowchart showing a process in a second example of the feed amount data setting system for the tape feeder.
Figure 9:
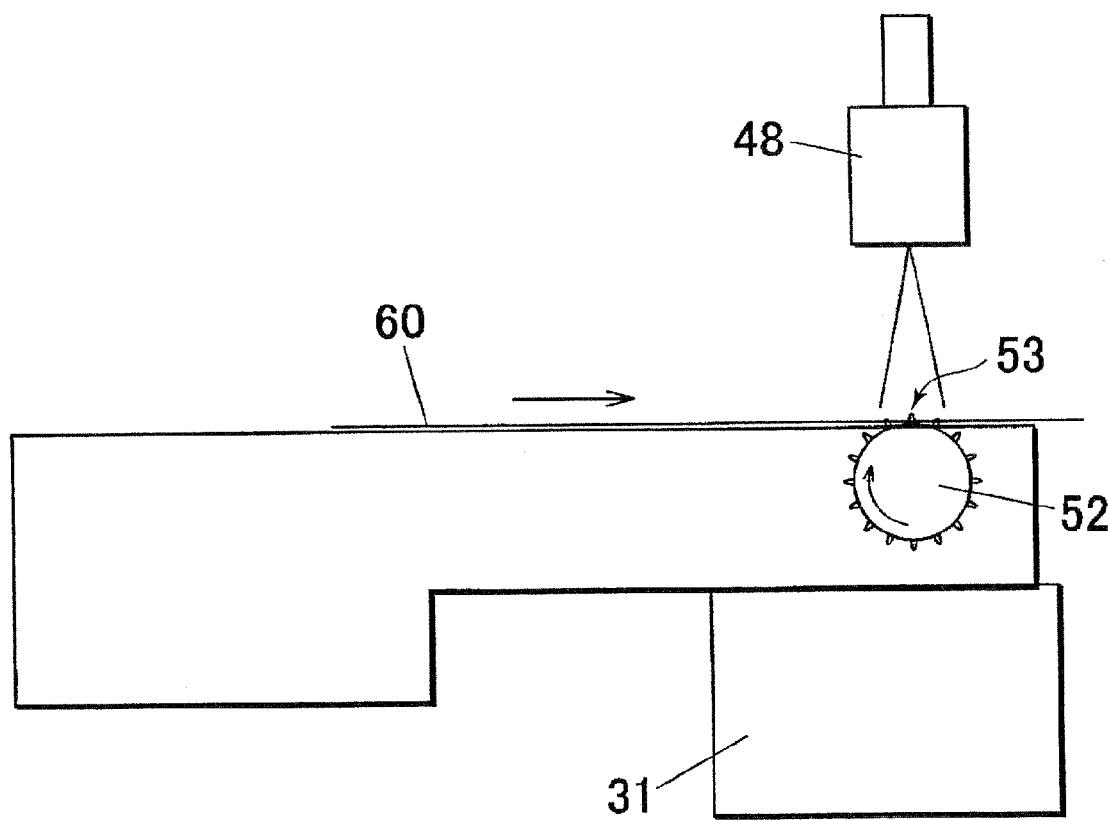
FIG. 9 is a front view of the second example.
Figure 10:
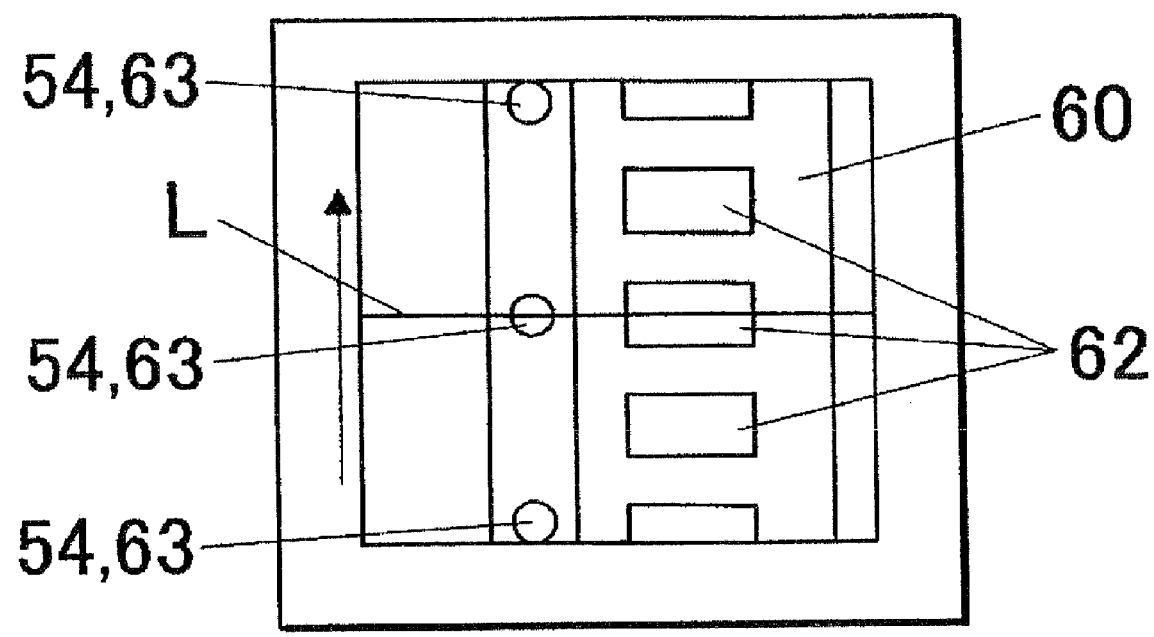
FIG. 10 illustrates one example of an image taken by a camera in the second example.

FIG. 8 is a flowchart showing a process in the second example of the feed amount data setting system. FIG. 9 is a front view of the second example, and FIG. 10 illustrates one example of an image taken by the camera in the second example.

Detailed description about the same configuration as that of the first example will be omitted, and a difference therefrom will be described below.

In the second example, the tape feeder 50 as a target for data setting is installed in the mounter 10 (Step S30), and the board-recognition camera 48 of the mounter 10 is moved to a position capable of taking an image around the pickup position 53 of the target tape feeder 50 (Step S31), in the same manner as that in the first example.

Subsequently, the motor 51 is driven (Step S32). Thus, the sprocket 52 of the target tape feeder 50 is drivenly rotated to allow that the tape 60 to be drivenly fed in the feed direction by the pins 54 provided on the sprocket 52, and respective positions of the component pockets 62 provided in the tape 60 are sequentially captured by the board-recognition camera 48 (Step S33).

As mentioned above, in each of the tape feeders 50 in this embodiment, the pickup position 53 is set in the same position as the uppermost region of the sprocket 52 in the feed direction of the tape 60. In the second example, a position of one of the component pockets 62 at a time when one of the electronic components reaches the pickup position 53, i.e., a position of one of the component pockets 62 at a time when a center of the component pockets 62 reaches a position on a line L extending in a direction perpendicular to the feed direction of the tape 60 and passing through the pickup position 53, will referred to as "true position" of the component pocket.

When it is detected that a specific one of the component pockets 62 reaches a true position thereof, in an image taken by the camera 48 (Step S34), the motor 51 is stopped according to a stop command from the controller 15 of the mounter 10, through the motor controller 55 of the feeder 50 (Step S35).

Then, one or two of the pins 54 located in the uppermost region of the sprocket 52 to drivingly feed the tape, at a time when the specific component pocket 62 reaches the true position, are identified by a pin number or the like, and the identification information is acquired as pin data (Step S36).

That is, in the tape 60 in the second example, as shown in FIG. 10, the component pockets 62 are formed not only just beside the respective feed holes 63 but also between adjacent ones of the feed holes 63. Thus, two of the pins 54 engaged with respective two of the feed holes 63 on both sides of the specific component pocket 62 can be located in the uppermost region of the sprocket 52 to drivingly feed the tape 60. In this case, data about a combination of the two pins drivingly feeding the tape 60 is acquired as pin data.

After the one pin 54 or the combination of the two pins 54 drivingly feeding the tape 60 is identified in the above manner, a rotational amount (rotational angle) of the motor 51 in a state when the specific component pocket 60 is located at the true position is detected by the encoder equipped in the motor 51, and acquired as position data (Step S37).

After the pin data and position data about the specific component pocket 62 are acquired in the above manner, the two data are stored in the feed amount data storage device of the target tape feeder 50 in correspondence with each other (Step S38), and the above steps will be repeated until pin data and position data about all the component pockets 54 are acquired (NO in Step S39), i.e., until the sprocket 52 is rotated 360 degrees or more. When data acquisition for all component pockets 54 is completed (YES in Step S39), the feed amount data setting process for the target tape feeder 50 is terminated.

In cases where the tape 60 which holds electronic components is used, the mounter 10 is configured to set feed amount data while mounting each electronic component onto a board. That is, after a specific one of the component pockets 62 reaches a true position thereof, an electronic component is mounted onto a board in parallel with Step S38. Specifically, the head unit 42 is moved to allow the suction nozzle of one of the heads 41 to be aligned with the specific component pocket 62 so as to suckingly hold an electronic component in the specific component pocket 62. Then, the head 41 is moved to a given position above a board to mount the electronic component onto the board. After a determination in Step S39 is made as YES, the mounting operation is shifted to a normal mode for performing a motor feeding operation based on the set feed amount data.

FIG. 11 shows one example of feed amount data to be set in the above manner.

As described above, in the second example, when one of the pockets 62 located just beside one of the feed holes 63 reaches a true position thereof (pickup position 53), the tape is mainly drivenly fed by one of pins 54 which is engaged with the feed hole 63. When one of the pockets 62 located between the adjacent two pins 54 reaches a true position thereof (pickup position 53), the tape is drivenly fed by the adjacent two pins 54 on both sides of the pocket 62.

Thus, in the second example, in addition to position data about the pockets 62 corresponding to the respective pins 54, position data about the pockets 62 corresponding to a combination of the adjacent two pins is set. The pins 54 are identified, respectively, by pin numbers 1 to N, and, when the tape 60 is drivenly fed by two of the pins 54, the position data is represented by a combination of the pin numbers of the two pins 54.

A specific representation method for the position data about each of the pockets 62 may include a method of representing a distance between adjacent ones of the pockets 62, a distance in a period where each of the pockets 62 is moved from a position corresponding to a zero phase of the motor 51 to a true position thereof, or a distance in a period where each of the pockets 62 is moved to a true position thereof from a position at a time when a specific one of the pins 54 selected as an origin is located at a true position thereof, by a rotational feed amount of the motor, i.e., serial data or a pulse number of the encoder, in the same manner as that in the first example.

In the second example, the same functions/effects as those in the first example can be brought out. In addition, respective positions of the pockets 62 of the tape 60 are detected. This makes it possible to more accurately detect a state when each electronic component reaches the pickup position to achieve a more accurate pickup operation.

Further, the respective pockets 62 of the tape 60 are detected. This makes it possible to allow a feed amount to be also set for the pocket 62 between adjacent ones of the pins 54 of the sprocket 52, so as to accurately feed it to the pickup position 53.

The following description will be made about a third example of the system for setting adequate feed amount data in each of the tape feeders 50, wherein a feed amount setting apparatus as a single-purpose apparatus is used for setting a motor feed amount in the tape feeder 50.

The feed amount setting apparatus in the third example is designed such that a positioning pin is brought into contact with each of the pins 54 formed on the sprocket 52 in each of the tape feeders 50 to stop the pin 54 at a true position thereof to create a state when each electronic component held by the tape 60 reaches the pickup position. Thus, in the third example, the data setting operation is performed without attaching the tape 60 to the tape feeder 50.

Detailed description about the same configuration as that of the first and second examples will be omitted, and a difference therefrom will be described below.

Figure 12:
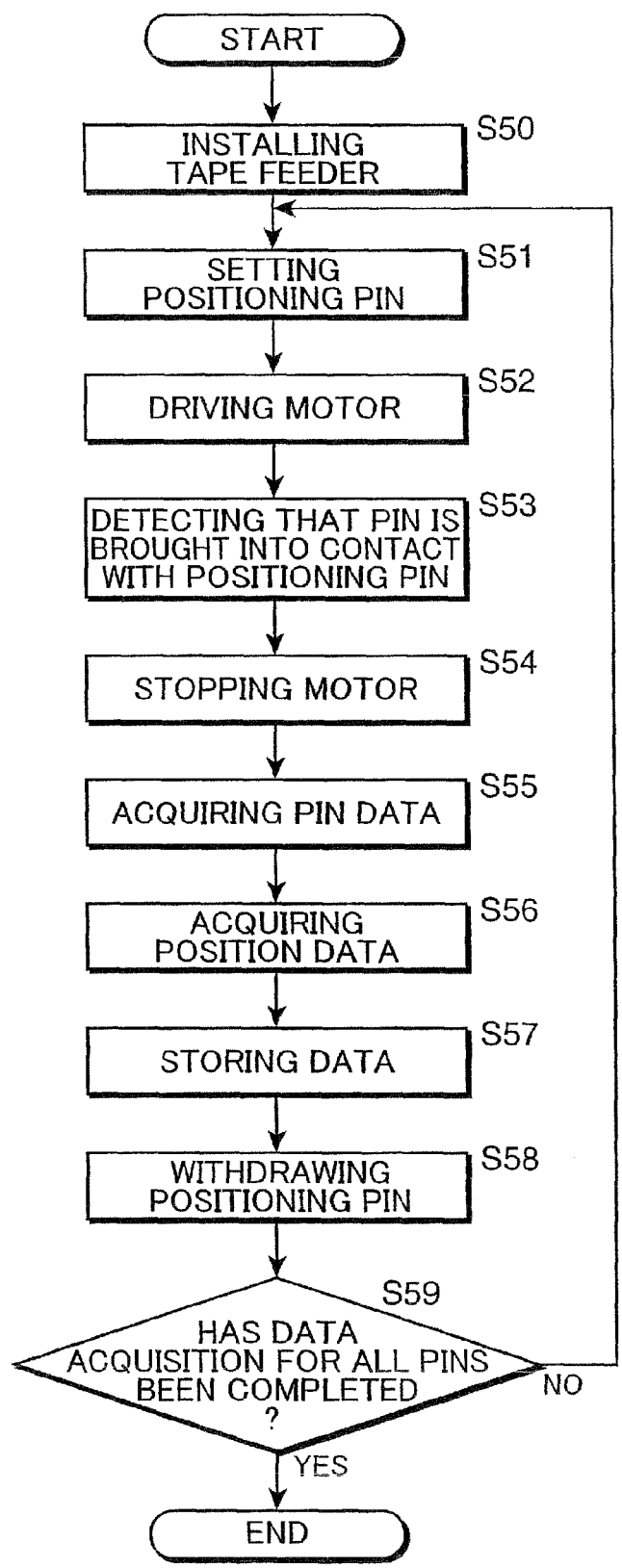
FIG. 12 is a flowchart showing a process in a third example of the feed amount data setting system for the tape feeder.
Figure 13:
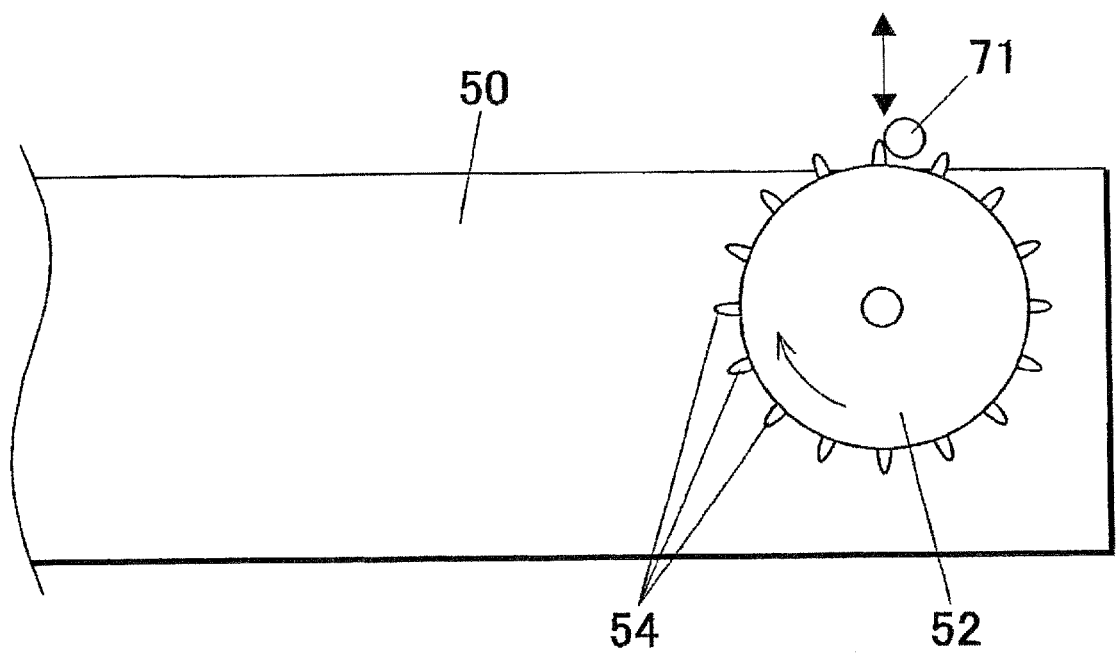
FIG. 13 is a front view of a motor feed amount setting apparatus for use in the third example.

FIG. 12 is a flowchart showing a process in the third example of the feed amount data setting system for the tape feeder. FIG. 13 is a front view of the motor feed amount setting apparatus for use in the third example, and FIG. 14 is an explanatory top plan view of the motor feed amount setting apparatus.

Figure 14:
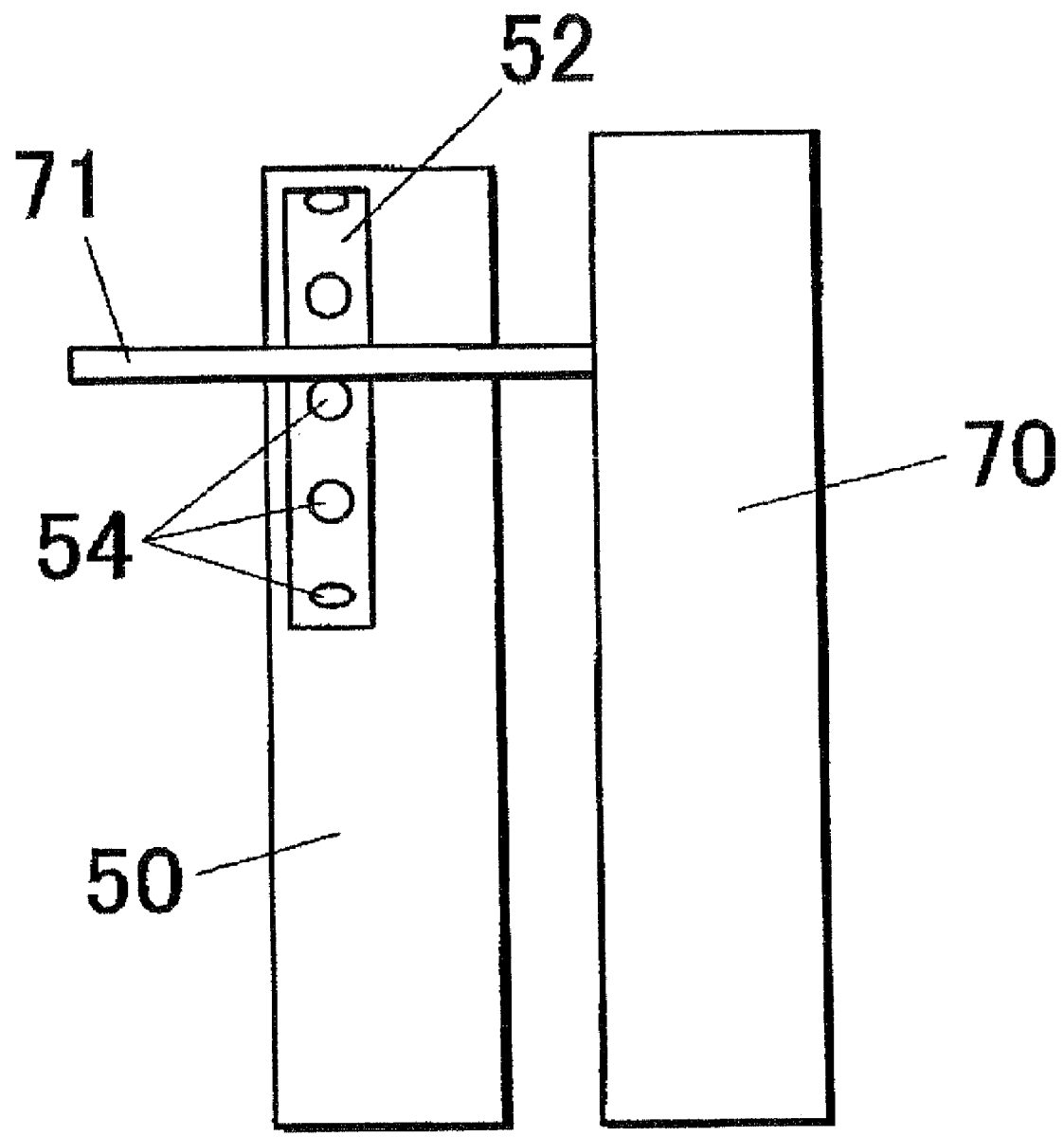
FIG. 14 is an explanatory top plan view of the motor feed amount setting apparatus. A side view showing a screen printing apparatus according to the present invention (screen printing apparatus using a superposition method according to the present invention).

As shown FIGS. 13 and 14, the motor feed amount setting apparatus 70 comprises a positioning pin 71 adapted to be brought into contact with each of the pins 54 of the tape feeder 50. The positioning pin 71 is adapted to be movable by an actuator (not shown) in such a manner as to be set at a position where it is brought into contact with one of the pins 54 of the tape feeder 50 when the pin 54 reached a true position thereof, and withdrawn upwardly to a position free of interference with the pins 54 of the tape feeder 50. In this withdrawal operation, the positioning pin 71 may be moved upwardly in a slidable or swingable manner, or may be moved in a horizontal direction perpendicular to the feed direction of the tape.

In the third example, the tape feeder 50 as a target for data setting is installed in the feed amount setting apparatus 70, in the same manner as that in the first and second examples (Step S50). In this operation, the motor controller 55 of the tape feeder 50 is electrically connected to a controller (not shown) of the feed amount setting apparatus 70 to allow for supply of driving power and receiving/sending of various signals. Then, the positioning pin 71 in the feed amount setting apparatus 70 is set in such a manner as to stop a specific one of the pins 54 of the tape feeder 54 at a true position thereof (Step S51).

Subsequently, according to a drive command from the controller of the feed amount setting apparatus 70, the motor 51 is driven through the motor controller 55 of the feeder 50 (Step S52). Thus, the sprocket 52 of the tape feeder 52 is drivenly rotated to move the pins 54 provided on the sprocket 52. Then, a specific one of the pins 54 located in the uppermost region of the sprocket 52 is brought into contact with the positioning pin 71 at a true position thereof, and a rotation of the sprocket 52 is stopped. When the rotation of the sprocket 52 is stopped, the motor 51 becomes unable to rotate. Thus, based on a change in motor current, motor speed or motor rotational amount, the motor controller 55 of the tape feeder 50 detects that the specific pin 54 is brought into contact with the positioning pin 71 to reach the true position (Step S53).

The, according to a stop command generated from the controller of the feed amount setting apparatus 70 in response to information about the detection that the specific pin 54 reaches the true position, the motor 51 is stopped through the motor controller 55 of the feeder 50 (Step S54).

Then, the specific pin 54 located at the true position, i.e., one of the pins 54 which is engaged with the feed hole 63 of the tape 60 to drivingly feed the tape 60, is identified by a pin number or the like, and the identification information is acquired as pin data (Step S55).

After the specific pin 54 located at the true position is identified in the above manner, a rotational amount (rotational angle) of the motor 51 in a state when the specific pin 54 is located at the true position is detected by the encoder equipped in the motor 51, and acquired as position data (Step S56).

After the pin data and position data about the specific pin 54 are acquired in the above manner, the two data are stored in the feed amount data storage device in correspondence with each other (Step S57), and the positioning pin 71 in contact with the pin 58 at the true position is withdrawn (Step S58).

The above steps will be repeated until pin data and position data about all the pins 54 are acquired (NO in Step S59), i.e., until the sprocket 52 is rotated 360 degrees or more. When data acquisition for all the pins 54 is completed (YES in Step S59), the feed amount data setting process for the tape feeder 50 is terminated.

In the third example, the same functions/effects as those in the first and second examples can be brought out. In addition, when each of electronic components reaches the pickup position 53, the positioning pin 71 is brought into contact with one of the pins 54 to stop the rotation of the sprocket 52. This makes it possible to reliably duplicate a state when each electronic component reaches the pickup position 53, and accurately obtain a feed amount of the motor 51 in the state.

Although the present invention has been described based on an embodiment thereof, the present invention is not limited to the above configuration, but the above embodiment may be appropriately modified as follows.

For example, in the above embodiment, a rotational amount of the motor is detected, after the rotation of the motor is stopped in a state of each electronic component reaches the pickup position. Alternatively, a feed amount of the motor in a state of each electronic component reaches the pickup position may be detected by detecting a timing when each electronic component reaches the pickup position, and detecting a rotational amount of the motor at a time when the timing is detected.

In the above embodiment, in cases where a single-purpose motor feed amount acquiring apparatus is used, the positioning pin is brought into contact with the sprocket to detect a state when each electronic component reaches the pickup position. Alternatively, even in cases where a single-purpose motor feed amount acquiring apparatus is used, each of the pins of the sprocket or each of the pockets of the tape may be detected by a camera to detect a state when each electronic component reaches the pickup position, as in the above first and second examples.

In the above embodiment, a feed amount of the motor is stored in each of the tape feeders. Alternatively, the feed amount of the motor may be stored in the mounter together with identification information capable of identifying each of the feeders, and a drive control for the motor may be performed according to a drive signal generated from the mounter based on the motor feed amount stored in the mounter. In this case, the controller of the mounter serves as a feed amount data storage device and a motor controller. This also makes it possible to accurately feed each electronic component to the pickup position while identifying each of the tape feeders installed in the mounter and referring to the pre-stored motor feed amount in each of the tape feeders, to achieve an accurate pickup operation.

In the above embodiment, in cases where the mounter is configured to additionally function as a feed amount data setting apparatus, in a process of setting/storing feed amount data, only a feed amount setting/storing operation is performed. Alternatively, when the tape 60 which holds electronic components is actually used, the electronic components fed to the pickup position 53 may be transferred onto an actual board to perform a component mounting operation while performing the feed amount setting/storing operation. Specifically, in a feed amount setting/storing operation, the electronic component held by the tape 60 are fed to the pickup position 53, and feed amounts of the motor 51 during the feeding are stored in the feed amount data storage device equipped in the tape feeder 50 or the mounter 10, in correspondence with respective ones of the pins 54 engaged with the feed holes 63 of the tape 60 to drive the tape 60. During this feed amount setting/storing operation, a mounting operation of mounting onto a board each electronic component to the pickup position 53 may be performed. Once the feed amounts are set/stored, a drive control of the motor 51 is performed based on the stored feed amounts in such a manner as to feed the electronic components to the pickup position 53 to perform the mounting operation of mounting the electronic components onto a board. In this case, feed amounts of the motor are stored while mounting onto a board the electronic components of the tape used for the storing operation. This makes it possible to avoid wasting the electronic components only for the feed amount storing operation.

The feed amount setting operation is performed for each tape feeder. Further, in cases where there is a possibility to use a plurality of tapes different in positional relationship between feed holes and component pockets even if the feed holes in each of the tapes have the same pitch as that of the pins of the sprocket, feed amount data is set on a tape-by-tape basis. Alternatively, the feed amount setting operation is performed for a given part of the tapes having a specific positional relationship between the feed holes and the component pockets, and, during a mounting operation using the remaining tape, a motor feeding control is performed while correcting data corresponding to a change in the positional relationship between the feed holes and the component pockets. In these cases, set values of the feed amount data are stored in the memory of the tape feeder in corresponding with respective tape IDs.

The present invention described as above is summarized as follows.

The present invention provides a feed amount data setting system for a tape feeder, wherein the tape feeder including a sprocket formed with a plurality of pins engageable with respective feed holes provided in a tape which holds electronic components, and a motor adapted to drivingly rotate the sprocket to drivingly feed the tape. The feed amount data setting system is configured to set a feed amount of the motor for allowing the electronic components held by the tape to be sequentially fed to a given pickup position, in such a manner as to rotationally control the motor to rotate the sprocket 360 degrees or more, while sequentially detecting feed amounts of the motor at respective times when respective ones of the electronic components held by the tape reach the pickup position, and store the sequentially detected feed amounts in a feed amount data storage device equipped in the feeder or a mounter, in correspondence with respective ones of the pins engaged with the feed holes of the tape to drivingly feed the tape at the respective times when the respective electronic components reach the pickup position.

In this system, instead of calculating a feed amount by correctively adding/subtracting a deviation amount (offset amount) to/from a certain feed amount, and feeding each electronic component to an estimated true position derived by the calculation, a feed amount itself of the motor at a time when each electronic component truly reaches a pickup position is stored. This makes it possible to duplicate a state when each electronic component reaches the pickup position, to achieve an accurate pickup operation.

More specifically, the feed amount data setting system is configured to take an image of the tape or each of the pins by a camera in a vicinity of the pickup position, to detect a state when each of the electronic components held by the tape reaches the pickup position.

In this configuration, an image of the tape or each of the pins is taken by the camera. This makes it possible to accurately detect a state when each electronic component reaches the pickup position, to allow a feed amount of the motor at a time when each electronic component reaches the pickup position, to be accurately acquired.

In another configuration, the feed amount data setting system comprises a stopper adapted, when each of the electronic components held by the tape reaches the pickup position, to be brought into contact with one of the pins which is engaged with one of the feed holes of the tape to drivingly feed the tape, to stop the rotation of the sprocket.

In this configuration, when each of electronic component reaches the pickup position, the a stopper is brought into contact with one of the pins to stop the rotation of the sprocket. This makes it possible to reliably duplicate a state when each electronic component reaches the pickup position, and accurately obtain a feed amount of the motor in the state.

The present invention also provides a tape feeder comprising a sprocket formed with a plurality of pins engageable with respective feed holes provided in a tape which holds electronic components, a motor adapted to drivingly rotate the sprocket to drivingly feed the tape, and a feed amount data storage device adapted to store feed amounts of the motor at respective times when respective ones of the electronic components held by the tape reach a given pickup position, in correspondence with respective ones of the pins engaged with the feed holes of the tape to drivingly feed the tape at the respective times when the respective electronic components reach the pickup position, wherein the motor is subjected to a drive control based on the feed amounts stored in the feed amount data storage device.

In this tape feeder, the tape feeder stores respective feed amounts of the pins by itself. This makes it possible to accurately feed each electronic component to the pickup position to achieve an accurate pickup operation, even if the tape feeder is installed in any installation position of a mounter.

Further, the present invention provides a mounter designed to allow a tape feeder to be installed therein, wherein the tape feeder includes a sprocket formed with a plurality of pins engageable with respective feed holes provided in a tape which holds electronic components, and a motor adapted to drivingly rotate the sprocket to drivingly feed the tape. The mounter comprises a feed amount data storage device adapted to store feed amounts of the motor at respective times when respective ones of the electronic components held by the tape reach a given pickup position, in correspondence with respective ones of the pins engaged with the feed holes of the tape to drivingly feed the tape at the respective times when the respective electronic components reach the pickup position, and a motor controller operable to perform a drive control for the motor, based on the feed amounts stored in the feed amount data storage device.

In this mounter, the mounter stores respective feed amounts of the pins of the tape feeder. The makes it possible to allow the tape feeder installed in the mounter to accurately feed each electronic component to the pickup position to achieve an accurate pickup operation.

More specifically, the mounter is operable to feed each of the electronic components held by the tape to the pickup position, and perform a mounting operation of mounting the electronic component fed to the pickup position onto a board, while storing the feed amounts in the feed amount data storage device, and, after the feed amounts are stored in the feed amount data storage device, to control the motor based on the stored feed amounts by the motor controller to feed each of the electronic components to the pickup position, and perform a mounting operation of mounting the electronic component to a board.

In this mounter, feed amounts of the motor are stored while mounting onto a board the electronic components of the tape used for the storing operation. This makes it possible to avoid wasting the electronic components only for the feed amount storing operation.

INDUSTRIAL APPLICABILITY

The feed amount data setting system, the tape feeder and the mounter of the present invention is useful in the field of mounting electronic components onto a board to manufacture a package board, and suitable for continuously maintaining mounting quality of a board at high levels.

The invention claimed is:

1. A feed amount data setting system, comprising:
a tape feeder, wherein said tape feeder including a sprocket formed with a plurality of pins engageable with respective feed holes provided in a tape which holds electronic components, and a motor adapted to drivingly rotate said sprocket to drivingly feed said tape,
said feed amount data setting system being configured to set a feed amount of said motor for allowing said electronic components held by said tape to be sequentially fed to a given pickup position so as to rotationally control said, motor to rotate said sprocket one or more turns, while sequentially detecting feed amounts of said motor at respective times when respective ones of said electronic components held by said tape reach said pickup position, and store said sequentially detected feed amounts in a feed amount data storage device equipped in said feeder or a mounter, in correspondence with respective ones of said pins engaged with said feed holes of said tape to drivingly feed said tape at said respective times when said respective electronic components reach said pickup position.

2. The feed amount data setting system as defined in claim 1, which is configured to take an image of said tape or each of said pins by a camera in a vicinity of said pickup position, to detect a state when each of said electronic components held by said tape reaches said pickup position.

3. The feed amount data setting system as defined in claim 1, which comprises a stopper adapted, when each of said electronic components held by said tape reaches said pickup position, to be brought into contact with one of said pins which is engaged with one of said feed holes of said tape to drivingly feed the tape, to stop the rotation of said sprocket.

4. A feed amount data setting system for a tape feeder, comprising:

a sprocket provided with a plurality of pins each engageable with a feed hole formed in a tape for holding electronic components;

a motor which drivingly rotates the sprocket to drivingly feed the tape;

a controller which controls the motor to rotate the sprocket;

a detector which detects a feed amount of the motor; and a storage which stores the feed amount of the motor for sequentially feeding the respective ones of the electronic components held on the tape to a predetermined pickup position, wherein the controller controls the detector to sequentially detect the feed amount of the motor at respective times when the respective ones of the electronic components held on the tape reach the pickup position, while controlling the motor to rotate the sprocket, and the controller controls the storage to store the sequentially detected feed amounts in correspondence with respective ones of the pins engaged with the feed holes formed in the tape to drivingly feed the tape at the respective times when the respective ones of the electronic components reach the pickup position.

* * * * *